(12) United States Patent
Hatwar

(10) Patent No.: US 6,720,092 B2
(45) Date of Patent: Apr. 13, 2004

(54) WHITE ORGANIC LIGHT-EMITTING DEVICES USING RUBRENE LAYER

(75) Inventor: Tukaram K. Hatwar, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/191,251

(22) Filed: Jul. 8, 2002

(65) Prior Publication Data

US 2004/0009367 A1 Jan. 15, 2004

(51) Int. Cl.[7] ............................................... H05B 33/14

(52) U.S. Cl. ..................... 428/690; 428/917; 313/502; 313/504; 313/506; 257/89

(58) Field of Search .................. 428/690, 917; 313/502, 504, 506; 257/88, 89

(56) References Cited

U.S. PATENT DOCUMENTS

| | | | |
|---|---|---|---|
| 4,539,507 A | 9/1985 | VanSlyke et al. | |
| 4,769,292 A | 9/1988 | Tang et al. | |
| 4,885,211 A | 12/1989 | Tang et al. | |
| 5,059,862 A | 10/1991 | VanSlyke et al. | |
| 5,405,709 A | 4/1995 | Littman et al. | |
| 5,683,823 A | 11/1997 | Shi et al. | |
| 5,776,622 A | 7/1998 | Hung et al. | |
| 5,935,721 A | 8/1999 | Shi et al. | |
| 6,208,075 B1 | 3/2001 | Hung et al. | |
| 6,447,934 B1 * | 9/2002 | Suzuki et al. | 428/690 |
| 6,459,199 B1 * | 10/2002 | Kido et al. | 313/504 |
| 6,614,176 B2 * | 9/2003 | Kim et al. | 313/506 |

FOREIGN PATENT DOCUMENTS

JP 7142169 6/1995

OTHER PUBLICATIONS

"Red Organic Light–Emitting Diodes Using an Emitting Assist Dopant" by Yuji Hamada et al., Applied Physics Letters, vol. 75, No. 12, Sep. 20, 1999, pp. 1682–1684.
"Interface Engineering in Preparation or Organic Surface–Emitting Diodes", by L. S. hung, et al., Applied Physics Letters vol. 74, No. 21, May 24, 1999, pp. 3209–3211.
"High–Efficiency Transparent Organic Light–Emitting Devices", by G. Parthasarathy, et al., Applied Physics Letters, vol. 76, No. 15, Apr. 10, 2000, pp. 2128–2130.
"A Metal–Free Cathode for Organic Semiconductor Devices" by G. Parthasarathy, et al., Applied Physics Letters, vol. 72, No. 17, Apr. 27, 1998, pp. 2138–2140.
"Semitransparent Cathodes for Organic Light–Emitting Devices" by P. E. Burrows, et al., Journal of Applied Physics, vol. 87, No. 6, Mar. 15, 2000, pp. 3080–3085.
"Transparent Organic Light Emitting Devices" by G. Gu, et al., Applied Physics Letters, 68(19), May 6, 1996, pp. 2606–2608.

(List continued on next page.)

Primary Examiner—Cynthia H. Kelly
Assistant Examiner—Dawn Garrett
(74) Attorney, Agent, or Firm—Raymond L. Owens

(57) ABSTRACT

An organic light-emitting diode (OLED) device which produces substantially white light includes a substrate; an anode disposed over the substrate; and a hole injecting layer disposed over the anode. The device further includes a hole-transport layer disposed over the hole injecting layer; a yellow light-emitting layer having rubrene or a derivative thereof greater than 50% by volume of the constituents of such yellow light-emitting layer that emits light in the yellow region of the spectrum and is disposed on the hole-transport layer; a light-emitting layer doped with a blue light-emitting compound, disposed directly on the yellow light-emitting layer; an electron-transport layer disposed over the blue light-emitting layer; and a cathode disposed over the electron-transport layer.

53 Claims, 4 Drawing Sheets

OTHER PUBLICATIONS

"White–Light–Emitting Organic Electroluminescent Devices Based on Interlayer Sequential Energy Transfer" by R. S. Deshpande, et al., Applied Physics Letters, vol. 75, No. 7, Aug. 16, 1999, pp. 888–890.

"White Light–Emitting Organic Electroluminescent Devices Using the ploy(N–vinylcarbazole) Emitter Layer Doped with Three Fluorescent Dyes", by J. Kido et al., Applied Physics Letters, 64 (7), Feb. 14, 1994, pp. 815–817.

* cited by examiner

WHITE ORGANIC LIGHT-EMITTING DEVICES USING RUBRENE LAYER

CROSS REFERENCE TO RELATED APPLICATIONS

Reference is made to commonly assigned U.S. patent application Ser. No. 09/651,624 filed Aug. 30, 2000, pending by Tukaram K. Hatwar entitled "White Organic Electroluminescent Devices with Improved Stability and Efficiency", and 09/930,050 filed Aug. 15, 2001, now U.S. Pat. No. 6,627,333 by Tukaram K. Hatwar entitled "White Organic Light-Emitting Devices with Improved Efficiency", the disclosures of which are incorporated herein.

FIELD OF THE INVENTION

The present invention relates to OLED devices that emit white light.

BACKGROUND OF THE INVENTION

An OLED device includes a substrate, an anode, a hole-transport layer made of an organic compound, an organic luminescent layer with suitable dopants, an organic electron-transport layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

Efficient white light producing OLED devices are considered a low cost alternative for several applications such as paper-thin light sources backlights in LCD displays, automotive dome lights, and office lighting. White light producing OLED devices should be bright, efficient, and generally have Commission International d'Eclairage (CIE) chromaticity coordinates of about (0.33, 0.33). In any event, in accordance with this disclosure, white light is that light which is perceived by a user as having a white color.

The following patents and publications disclose the preparation of organic OLED devices capable of emitting white light, comprising a hole-transport layer and an organic luminescent layer, and interposed between a pair of electrodes.

White light producing OLED devices have been reported before by J. Shi (U.S. Pat. No. 5,683,823) wherein, the luminescent layer includes a red and blue light-emitting material uniformly dispersed in a host emitting material. This device has good electroluminescent characteristics, but the concentration of the red and blue dopants are very small, such as 0.12% and 0.25% of the host material. These concentrations are difficult to control during large-scale manufacturing.

Sato et al. in JP 07,142,169 discloses an OLED device, capable of emitting white light, made by sticking a blue light-emitting layer next to the hole- transport layer and followed by a green light-emitting layer having a region containing a red fluorescent layer.

Kido et al. in Science, Vol. 267, p. 1332 (1995) and in APL vol. 64, p. 815 (1994) report a white light producing OLED device. In this device three emitter layers with different carrier transporting properties, each emitting blue, green, or red light, are used to generate white light.

Littman et al. in U.S. Pat. No. 5,405,709 disclose another white emitting device, which is capable of emitting white light in response to hole-electron recombination and comprises a fluorescent in a visible light range from bluish green to red.

Recently, Deshpande et al., in Applied Physics Letters, vol. 75, p. 888 (1999) published white OLED device using red, blue, and green luminescent layers separated by a hole blocking layer.

However, these OLED devices require very small amounts of dopant concentrations, making the process difficult to control for large-scale manufacturing. Also, emission color varies due to small changes in the dopant concentration.

SUMMARY OF THE INVENTION

It is an object of the present invention to produce an effective white light-emitting organic device.

It is another object of this invention to provide an efficient and stable white light producing OLED device with simple structure and which can be reproduced in manufacturing environment.

It has been found quite unexpectedly that white light producing OLED devices with high luminance efficiency and operational stability can be obtained by depositing yellow light-emitting layer adjacent to the blue emission layer.

This object is further achieved by an organic light-emitting diode (OLED) device which produces substantially white light, comprising:

a) a substrate;

b) an anode disposed over the substrate;

c) a hole injecting layer disposed over the anode;

d) a hole-transport layer disposed over the hole injecting layer;

e) a yellow light-emitting layer having rubrene or a derivative thereof greater than 50% by volume of the constituents of such yellow light-emitting layer that emits light in the yellow region of the spectrum and is disposed on the hole-transport layer;

f) a light-emitting layer doped with a blue light-emitting compound, disposed directly on the yellow light-emitting layer;

g) an electron-transport layer disposed over the blue light-emitting layer; and h) a cathode disposed over the electron-transport layer.

This object is further achieved by an organic light-emitting diode device which produces substantially white light, comprising:

a) a substrate;

b) an anode disposed over the substrate;

c) a hole injecting layer disposed over the anode;

d) a hole-transport layer disposed over the hole injecting layer;

e) a light-emitting layer doped with a blue light-emitting compound, disposed directly on the hole-transport layer;

f) a yellow light-emitting layer having rubrene or a derivative thereof greater than 50% by volume of the constituents of such yellow light-emitting layer that emits light in the yellow region of the spectrum and is disposed on the blue-emitting layer;

g) an electron-transport layer disposed directly over the yellow light-emitting layer; and h) a cathode disposed over the electron-transport layer.

ADVANTAGES

The following are features and advantages of the present invention:
- a simplified OLED device for producing white light by having a yellow light-emitting rubrene layer on the hole-transport layer, or over the electron-transport layer, or over both the hole-transport layer and the electron transport layer; and
- an OLED device which is easy to control blue and yellow light-emitting layers.

OLED devices made in accordance with the present invention can be produced with high reproducibility and consistently provide high light efficiency. These devices have high operational stability and also require low drive voltage.

DETAILED DESCRIPTION OF THE INVENTION

Figure 1:
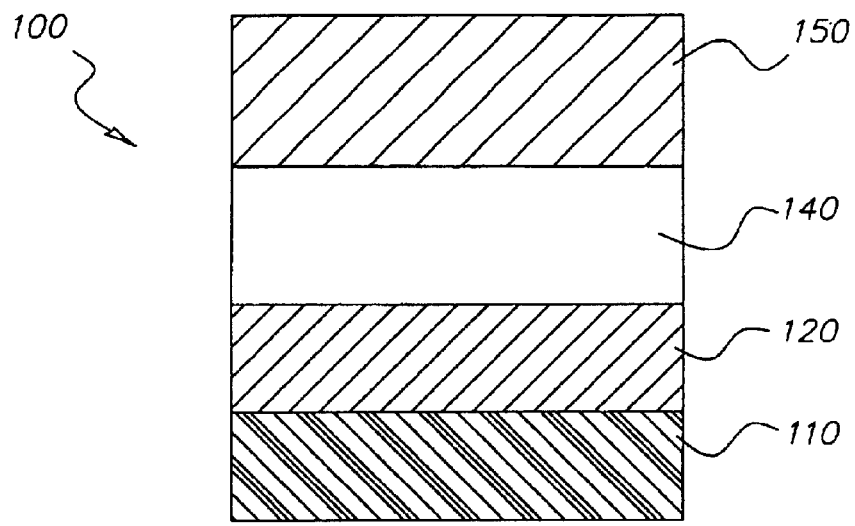
FIG. 1 depicts a prior art organic light-emitting device.

A conventional light-emitting layer of the organic OLED device comprises a luminescent or fluorescent material where electroluminescence is produced as a result of electron-hole pair recombination in this region. In the simplest construction OLED device 100, as shown in FIG. 1, a light-emitting layer 140 is sandwiched between anode 120 and cathode 150. The substrate is labeled as 110. The light-emitting layer 140 is a pure material with a high luminescent efficiency. A well known material is tris(8-quinolinato) aluminum (Alq) which produces excellent green electroluminescence.

Figure 2:
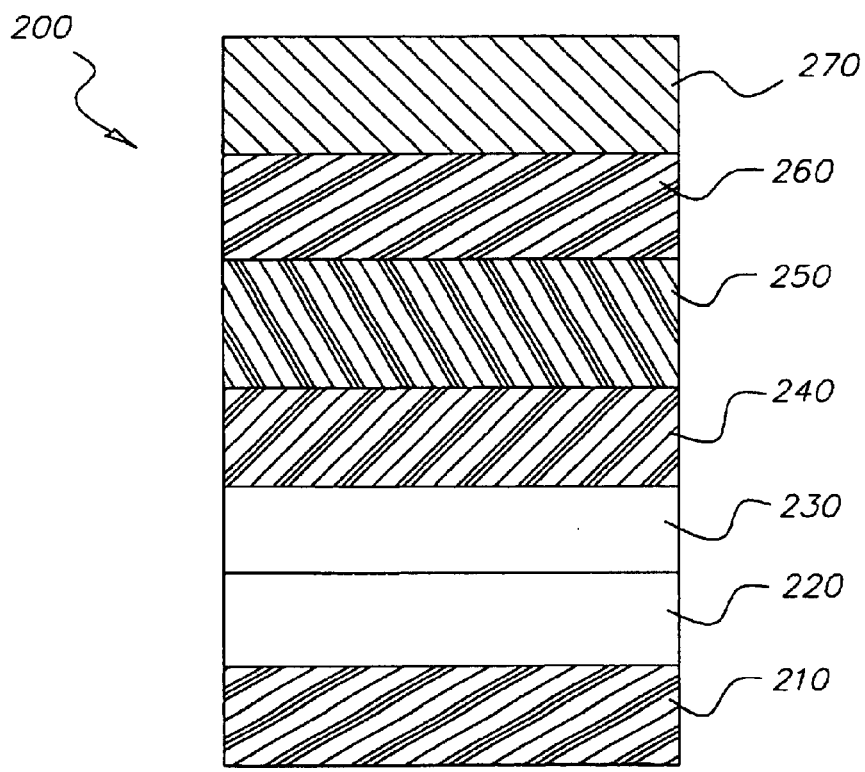
FIG. 2 depicts another prior art organic light-emitting device.

The simple structure can be modified to a three-layer structure as shown in FIG. 2, in which an additional electroluminescent layer is introduced between the hole and electron-transport layers to function primarily as the site for hole-electron recombination and thus electroluminescence. In this respect, the functions of the individual organic layers are distinct and can therefore be optimized independently. Thus, the electroluminescent or recombination layer can be chosen to have a desirable OLED color as well as high luminance efficiency. Likewise, the electron and hole-transport layers can be optimized primarily for the carrier transport property. It will be understood to those skilled in the art that the electron-transport layer and the cathode can be made to be transparent thus facilitating illumination of the device through its top layer and not through the substrate.

Turning to FIG. 2, an organic light-emitting device 200 has a light-transmissive substrate 210 on which is disposed a light-transmissive anode 220. An organic light-emitting structure is formed between the anode 220 and a cathode 270. The organic light-emitting structure is comprised of, in sequence, a hole injection (thin fluorocarbon) layer 230 an organic hole-transport layer 240, an organic light-emitting layer 250, and an organic electron-transport layer 260. When an electrical potential difference (not shown) is applied between the anode 220 and the cathode 270, the cathode will inject electrons into the electron-transport layer 260, and the electrons will migrate across layer 240 to the light-emitting layer 250. At the same time, holes will be injected from the anode 220 into the hole-transport layer 240. The holes will migrate across layer 230 and recombine with electrons at or near a junction formed between the hole-transport layer 240 and the light-emitting layer 250. When a migrating electron drops from its conduction band to a valance band in filling a hole, energy is released as light, which is emitted through the light-transmissive anode 220 and substrate 210.

The organic OLED devices can be viewed as a diode, which is forward biased when the anode is at a higher potential than the cathode. The anode and cathode of the organic OLED device can each take any convenient conventional form, such as any of the various forms disclosed by Tang et al. U.S. Pat. No. 4,885,211. Operating voltage can be substantially reduced when using a low-work function cathode and a high-work function anode. The preferred cathodes are those constructed of a combination of a metal having a work function less than 4.0 eV and one other metal, preferably a metal having a work function greater than 4.0 eV. The Mg:Ag of Tang et al. U.S. Pat. No. 4,885,211 constitutes one preferred cathode construction. The Al:Mg cathodes of Van Slyke et al. U.S. Pat. No. 5,059,862 is another preferred cathode construction. Hung et al. in U.S. Pat. No. 5,776,622 has disclosed the use of a LiF/Al bilayer to enhance electron injection in organic OLED devices. Cathodes made of either Mg:Ag, Al:Mg, or LiF/Al are opaque and displays cannot be viewed through the cathode. Recently, series of publications (Gu et al. in APL 68, 2606 [1996]; Burrows et al., J. Appl. Phys. 87, 3080 [2000]; Parthasarathy et al., APL 72, 2138 1998]; Parthasarathy et al., APL 76, 2128 [2000], Hung et al., APL, 3209 [1999]) have disclosed transparent cathode. These cathodes are based on the combination of thin semitransparent metal (~100 A) and indium-tin-oxide (ITO) on top of the metal. An organic layer of copper phthalocyanine (CuPc) also replaced thin metal.

Conventional anodes 220 are formed of a conductive and transparent oxide. Indium tin oxide has been widely used as the anode contact because of its transparency, good conductivity, and high work function.

In a preferred embodiment, an anode 220 can be modified with a hole injection layer 220b. An example of material in such a hole injection layer is the fluorocarbons disclosed by Hung et al. U.S. Pat. No. 6,208,075.

The light-transmissive substrate 210 can be constructed of glass, quartz, or a plastic material.

Preferred materials for use in forming the hole-transport layer of the organic OLED devices are tertiary amines as taught in Van Slyke U.S. Pat. No. 4,539,507. Another class of preferred amines is tetraaryl amines. Preferred tetraaryldiamines include two diarylamino groups, such as indicated by formula (III), linked through an arylene group. Preferred tetraaryldiamines include those represented by formula:

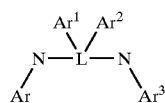

(III)

wherein:
Ar, $Ar^1$, $Ar^2$ and $Ar^3$ are independently selected from among phenyl, biphenyl, and naphthyl moieties;
L is a divalent naphthylene moiety or $d_n$;
d is a phenylene moiety;
n is an integer of from 1 to 4; and
at least one of Ar, $Ar^1$, $Ar^2$ and $Ar^3$ is a naphthyl moiety when L is $d_n$.

The various alkyl, alkylene, aryl, and arylene moieties of these structures can each in turn be substituted for structural formulae of tertiary amines. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain 5, 6, or 7 ring carbon atoms, e.g. cyclopentyl, cyclohexyl, and cycloheptyl ring structures. When the aryl and arylene moieties are not fused aromatic ring moieties, they are preferably phenyl and phenylene moieties.

Illustrative of useful selected (fused aromatic ring containing) aromatic tertiary amines (ATA) are the following:

ATA-1 4,4'-Bis[N-(1-naphthyl)-N-phenylamino]biphenyl (NPB)
ATA-2 4,4"-Bis[N-(1-naphthyl)-N-phenylamino]-p-terphenyl
ATA-3 4,4'-Bis[N-(2-naphthyl)-N-phenylamino]biphenyl
ATA-4 4,4'-Bis[N-(3-acenaphthenyl)-N-phenyl-amino]biphenyl
ATA-5 1,5-Bis[N-(1-naphthyl)-N-phenylamino]naphthatene
ATA-6 4,4'-Bis[N-(9-anthryl)-N-phenylamino]-biphenyl
ATA-7 4,4"-Bis[N-(1-anthryl)-N-phenylamino]-p-terphenyl
ATA-8 4,4'-Bis[N-(2-phenanthryl)-N-phenyl-amino]biphenyl
ATA-9 4,4'-Bis[N-(8-fluoranthenyl)-N-phenyl-amino]biphenyl
ATA-10 4,4'-Bis[N-(2-pyrenyl)-N-phenylamino]biphenyl
ATA-11 4,4'-Bis[N-(2-naphthacenyl)-N-phenyl-amino]biphenyl
ATA-12 4,4'-Bis[N-(2-perylenyl)-N-phenylamino]biphenyl
ATA-13 4,4'-Bis[N-(1-coronenyl)-N-phenylamino]biphenyl
ATA-14 2,6-Bis(di-p-tolylamino)naphthalene
ATA-15 2,6-Bis[di-(1-naphtyl)amino]naphthalene
ATA-16 2,6-Bis[N-(1-naphthyl)-N-(2-naphthyl)-amino]naphthalene
ATA-17 N,N,N',N'-Tetra(2-naphthyl)-4,4"-di-amino-p-terphenyl
ATA-18 4,4'-Bis {N-phenyl-N-[4-(1-naphthyl)-phenyl]amino}biphenyl
ATA-19 4,4'-Bis[N-phenyl-N-(2-pyrenyl)amino]biphenyl
ATA-20 2,6-Bis[N,N-di(2-naphthyl)amine]fluorene
ATA-21 1,5-Bis[N-(1-naphthyl)-N-phenylamino] naphthalene Preferred materials for use in forming the electron-transport layer of the organic OLED devices of this invention are metal chelated oxinoid compounds, including chelates of oxine itself (also commonly referred to as 8-quinolinol or 8-hydroxyquinoline) as disclosed in U.S. Pat. No. 4,885,211. Such compounds exhibit both high levels of performance and are readily fabricated in the form of thin layers. The electron-transport layer also can be made of porphyrinic compound as disclosed in U.S. Pat. No. 5,683,823. Highly preferred examples of useful porphyrinic compounds are metal free phthalocyanines and metal containing phthalocyanines. Illustrative of useful porphyrinic compound is copper phthalocyanine (CuPc).

A preferred embodiment of the luminescent layer consists of a host material doped with fluorescent dyes. Using this method, highly efficient EL devices can be constructed. Simultaneously, the color of the EL devices can be tuned by using fluorescent dyes of different emission wavelengths in a common host material. Tang et al. in commonly assigned U.S. Pat. No. 4,769,292 has described this dopant scheme in considerable detail for EL devices using Alq as the host material.

Shi et al. in commonly assigned U.S. Pat. No. 5,935,721 has described this dopant scheme in considerable detail for the blue-emitting OLED devices using 9,10-di-(2-naphthyl) anthracene (ADN) derivatives as the host material.

Preferred host materials for the blue luminescent layer of this invention include:

a) ADN

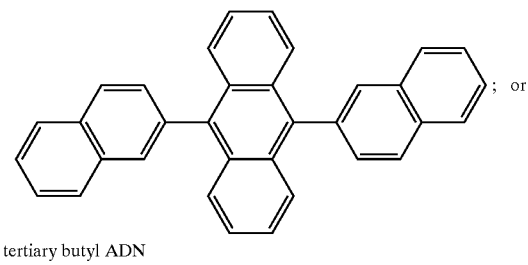

; or b) tertiary butyl ADN

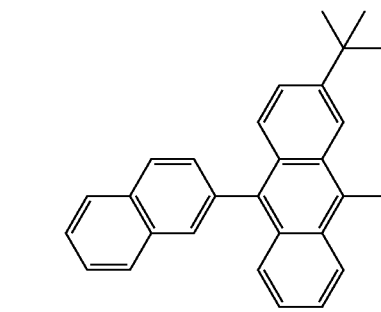

The following is the list of blue fluorescent dopants that are contemplated for use in the practice of this invention.

i) perylene

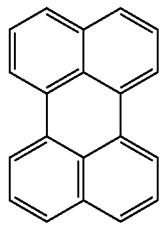

ii) 2, 5, 8, 11-tetra-tert-butyl perylene, and iii) conjugated benzenoids

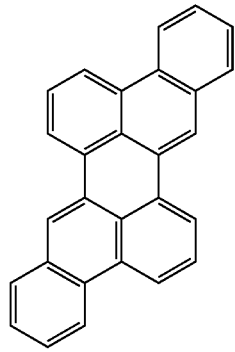

Preferred materials for use as a yellow emission layer are rubrene class materials. These are hydrocarbon compounds containing a polycyclic benzoid chromophoric unit. Hamada et al. reported in Applied Phys. Lett. Vol. 75, 1682 (1999) a red color emitting OLED device by doping rubrene in hole-transport layers and DCM2 dopants into Alq emission layer.

The yellow emitting layer of this invention substantially consists of herein termed rubrene or derivatives thereof, including 5,6,11,12-tetra-substituted naphthacenes having the following formula

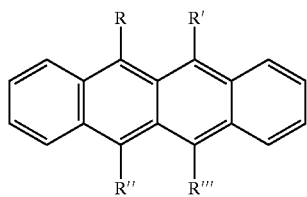

R, R', R", and R'", which may be the same or different, are individually aryl groups such as phenyl, biphenylyl, or naphthyl; or heteroaryl groups such as benzothiazolylphenyl. Examples of such rubrene derivatives include 5,6,11, 12-tetraphenylnaphthacene and 5,6,11,12-tetrakis(2-naphthyl)naphthacene. Additional substituents such as alkyl, aryl, fluorinated alkyl, fluoro, or cyano may be present on the naphthacene moiety, on the aryl or heteroaryl groups R, R,' R", and R'", or on both the naphthacene moiety and the aryl or hetetroaryl groups R, R', R", and R'". An example of such an additionally substituted stabilizing dopant is 6,11-diphenyl-5,12-bis(4-(6-methyl-benzothiazol-2-yl)phenyl) naphthacene. Currently preferred are rubrene and rubrene derivatives with molecular weights not exceeding about 800 Daltons. Currently most preferred is rubrene.

Some of the rubrene class materials are given below.

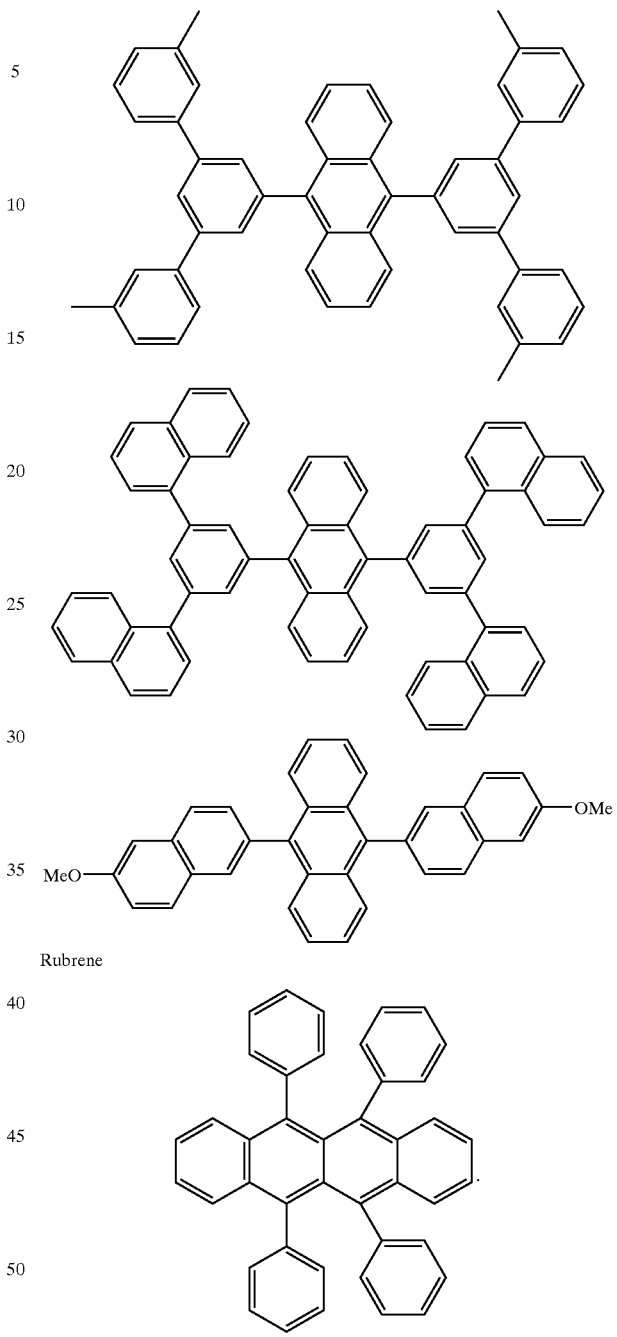

The invention and its advantages are further illustrated by the following specific examples. The term "percentage" indicates the volume percentage of a particular dopant with respect to the host material. This was based on the ratio of the thickness of each of the material recorded on the thickness monitor during the vacuum deposition process.

Figure 3:
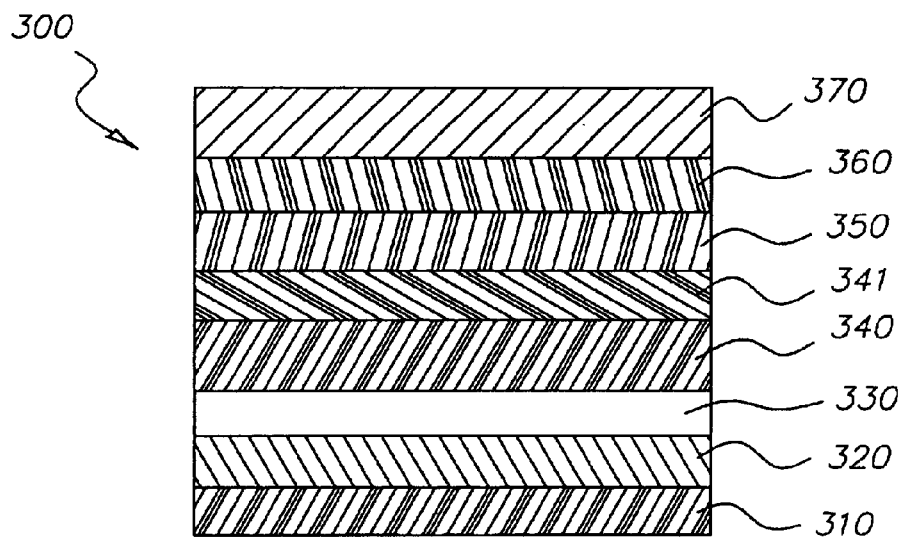
FIG. 3 depicts a white light producing OLED device wherein the yellow light-emitting layer is deposited on the hole-transport layer.
Figure 4:
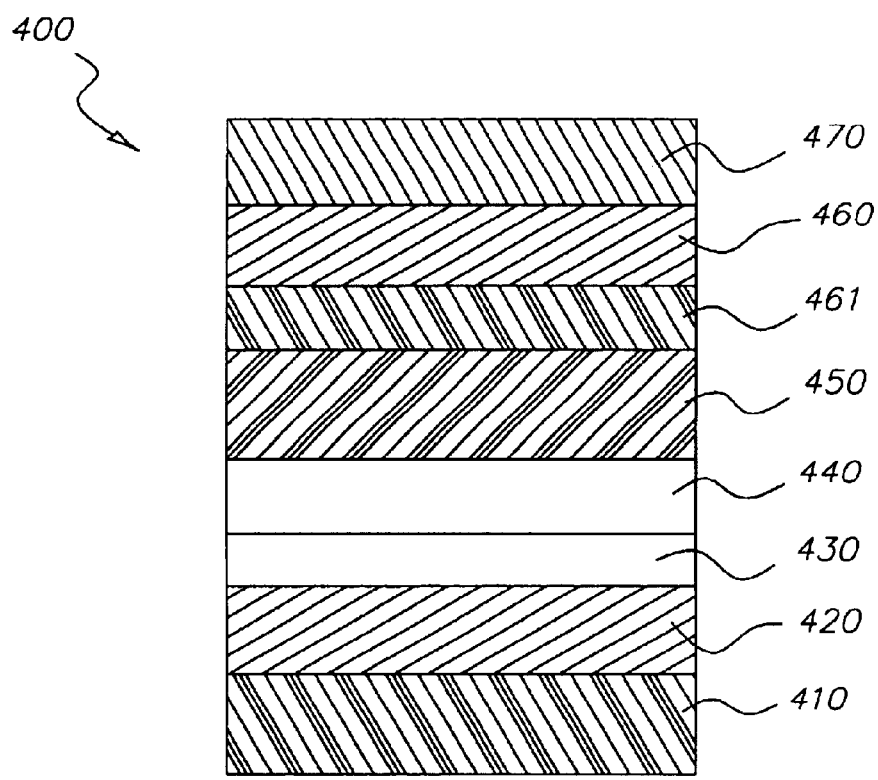
FIG. 4 depicts a white light producing OLED device wherein the yellow light-emitting layer is deposited on the blue emission layer.
Figure 5:
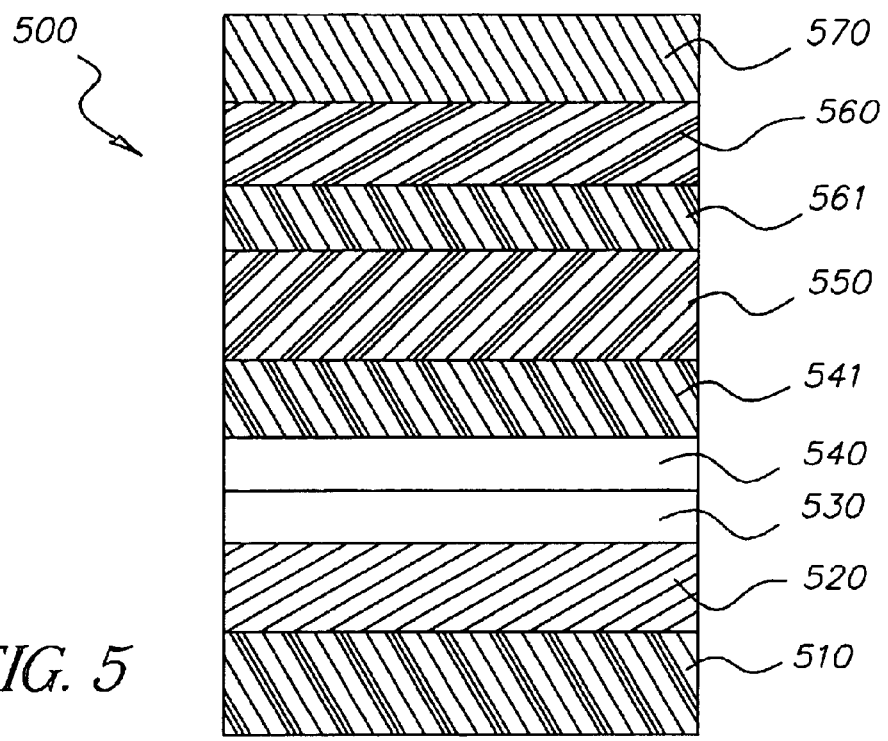
FIG. 5 depicts another structure of white light producing OLED device wherein the first yellow light-emitting layer is deposited on the hole-transport layer and the second yellow emitting layer is deposited on the blue emission layer.

FIGS. 3–5 show the white light producing OLED device structure prepared according to the present invention and graphs of various parameters of their operations. The invention and its advantages are further illustrated by the following specific examples.

Turning to FIG. 3, an organic white light-emitting device 300 has a light-transmissive substrate 310 on which is disposed a light-transmissive anode 320, hole injection layer 330, and hole-transport layer 340. An organic white light-emitting structure is formed between the anode 320 and a cathode 370. The organic light-emitting structure comprises, in sequence, an organic hole-transport layer 340, a yellow light-emitting rubrene compound layer 341 and blue-emitting layer organic light-emitting layer 350. An organic electron-transport layer 360 is made of Alq.

FIG. 4 depicts an organic white light-emitting device 400 which is similar to that shown in FIG. 4, except that the yellow light-emitting layer (461) is deposited on the blue-emitting organic layer 450. Other layers are substrate 410, anode 420, hole injection layer 430, hole-transport layer 440, electron-transport layer 460 and cathode 470.

FIG. 5 depicts yet another structure of organic white light-emitting OLED device 500. This structure contains the features of both the structures of FIG. 3 and FIG. 4. Layer 550 is an organic blue-emitting layer. It has two yellow emitting layers made of rubrene compound layer. The first yellow light-emitting rubrene compound layer 541 and the second yellow light-emitting rubrene compound layer 561 are disposed adjacent to the blue-emitting layer 550. Other layers are a substrate 510, anode 520, hole injection layer 530, hole-transport layer 540, electron-transport 560 and a cathode layer 570.

Figure 6:
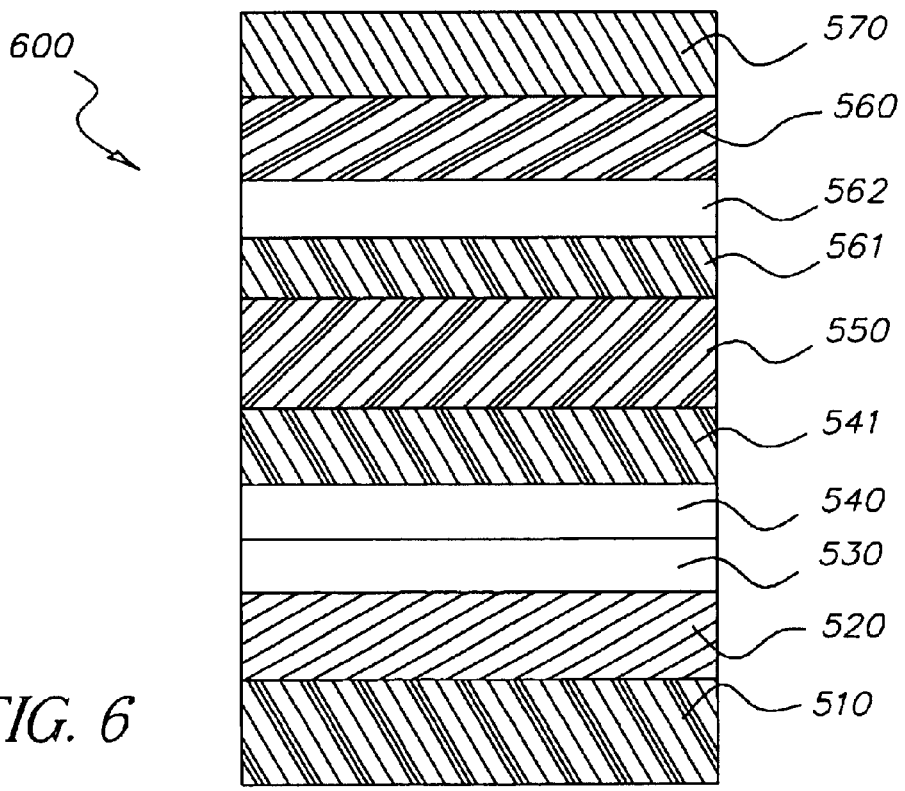
FIG. 6 depicts another structure of white light producing OLED device wherein a green emitting layer is deposited on the second yellow emitting layer.

FIG. 6 depicts yet another structure of organic white light-emitting OLED device 600. This structure is similar to that of FIG. 5, except that an additional green emitting layer 562 is deposited on the second yellow rubrene compound emitting layer.

The invention is further described with the following examples.

EXAMPLE 1

An OLED device was constructed in the following manner.

Substrates coated with 80 nm ITO was sequentially ultra-sonicated in a commercial detergent, rinsed in deionized water, and degreased in toluene vapor. These substrates were treated with an oxygen plasma for about one minute and coated with 1 nm fluorocarbon layer by plasma assisted deposition of $CHF_3$. The same procedure was used for preparing all other devices described in this invention. These substrates were loaded into a deposition chamber for organic layers and cathode depositions.

The device of Example 1 was prepared by sequential deposition of 150 nm NPB hole-transport layer (HTL), 20 nm blue emission layer (EML) comprising TBADN host with 1.5% TBP blue dopant, 37.5 nm Alq electron-transport layer (ETL), then 0.5 nm LiF and 200 nm Al as a part of cathode. The above sequence completed the deposition of the OLED device.

The OLED device was then hermetically packaged in a dry glove box filled with nitrogen for protection against ambient environment. The ITO patterned substrates used for preparing these OLED devices contained several test patterns. Each of the devices was tested for current voltage characteristics and the electroluminescence yield. The device characteristics measured at 20 $mA/cm^2$ are shown in Table 1. This is a blue-emitting device with luminance yield 2.8 cd/A and CIEx,y=0.16, 0.23.

TABLE 1

Device layer thickness and EL properties

| Examples | HTL thickness | Rubrene layer thickness | Blue Emission Layer thickness | AlQ ETL thickness | Drive Voltage (Volts) | Luminance Yield (cd/A) | EL main peak position | CIEx | CIEy | Device color |
|---|---|---|---|---|---|---|---|---|---|---|
| Example 1 | 150 nm NPB | 0 nm | 20 nm | 35 nm | 7.5 | 2.8 | 464 nm | 0.16 | 0.23 | Blue |
| Example 2 | 150 nm NPB | 0.05 nm | 20 nm | 35 nm | 7.1 | 3.3 | 464 nm | 0.21 | 0.28 | Blue |
| Example 3 | 150 nm NPB | 0.1 nm | 20 nm | 35 nm | 7.3 | 3.5 | 464 nm | 0.25 | 0.32 | Blue-white |
| Example 4 | 150 nm NPB | 0.2 nm | 20 nm | 35 nm | 6.5 | 3.6 | 464 nm | 0.30 | 0.35 | White |
| Example 5 | 150 nm NPB | 0.5 nm | 20 nm | 35 nm | 6.5 | 3.7 | 464 nm | 0.35 | 0.35 | White |
| Example 6 | 150 nm NPB | 1 nm | 20 nm | 35 nm | 6.5 | 3.6 | 464 nm | 0.37 | 0.35 | White |

The device of Example 2 was prepared following the same sequence as Device A, except that after depositing 150 nm NPB hole-transport layer, a thin layer of rubrene compound about 0.05 nm thick was deposited on the hole-transport layer. This device is also has blue emission with luminance yield 3.3 cd/A and CIEx,y=0.21, 0.28.

The device of Example 3 was prepared following the same sequence as the device of Example 2, except that after depositing 150 nm NPB hole-transport layer, a thin layer of rubrene compound of about 0.1 nm thick was deposited on the hole-transport layer. This device has blue-white emission with luminance yield 3.5 cd/A and CIEx,y=0.25, 0.35.

The device of Example 4 was prepared following the same sequence as the device of Example 2, except that after depositing 150 nm NPB hole-transport layer, a thin layer of rubrene compound of about 0.2 nm thick was deposited on the hole-transport layer. This device has white emission with luminance yield 3.6 cd/A and CIEx,y=0.30, 0.35.

The device of Example 5 was prepared following the same sequence as the device of Example 2, except that after depositing 150 nm NPB hole-transport layer, a thin layer of rubrene compound 0.5 nm thick was deposited on the hole-transport layer. This device also has white emission. The luminance yield for device of Example 5 has luminance yield of 3.7 cd/A and CIEx,y=0.35, 0.35.

The device of Example 6 was prepared following the same sequence as the device of Example 2, except that after depositing 150 nm NPB hole-transport layer, a thin layer of rubrene compound 1 nm thick was deposited on the hole-transport layer. This device also has white emission. The device of Example 6 has luminance yield of 3.6 cd/A and color coordinates of CIEx,y=0.37, 0.35. Thus, white light was produced at optimum yellow light-emitting layer thickness adjacent to the blue-emitting organic layer.

Figure 7:
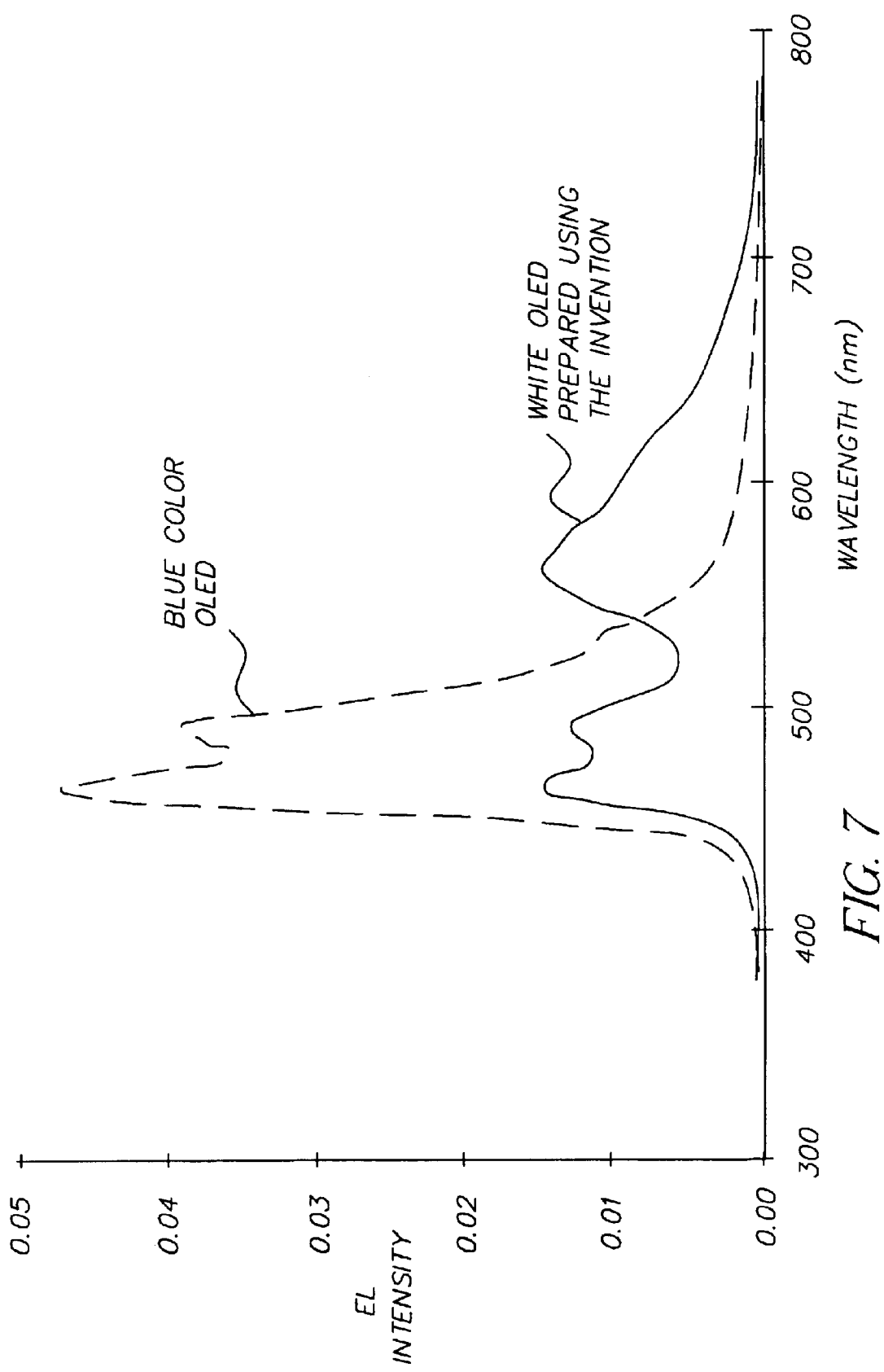
FIG. 7 shows EL spectral distribution of a white OLED device obtained using this invention.

FIG. 7 shows the EL spectra from the device of Example 1 and from the device of Example 5.

White color with CIE coordinates (0.35, 0.35) is obtained with luminance efficiency of 3.7 cd/A @20 $mA/cm^2$, when the yellow light-emitting layer thickness is 0.1 nm to 1 nm.

This is an important feature of this invention that depositing a thin yellow light-emitting layer on the NPB hole-transport layer adjacent to a blue light emission layer can produce white light OLED.

It was also found that the yellow rubrene layer can be mixed with another material such as a hole-transport material such as NPB or an electron-transport material such as Alq. For example, the yellow light-emitting layer 341 of FIG. 3 or layer 541 of FIGS. 5 and 6 can be doped with NPB hole-transport material such that the yellow light-emitting layer having rubrene or a derivative thereof contains greater than 50% by volume of the rubrene constituents. Similarly, the yellow rubrene layer can be mixed with another electron-transport material such as a Alq. For example, the yellow emitting layer 461 of FIG. 4 or layer 561 of FIGS. 5 and 6 can be doped with Alq electron-transport material such that the yellow light-emitting layer having rubrene or a derivative thereof contains greater than 50% by volume of the rubrene constituents.

The operational stability of the encapsulated OLED devices in ambient environments was found by measuring the changes in the drive voltage and the luminance as a function of time when OLED devices were operated at a constant current density of 20 mA/cm$^2$. White OLED devices prepared by following the different structures of this invention have high operational stability.

Thus, the white OLED devices of this invention were prepared by depositing yellow light-emitting layer adjacent to the blue-emitting layer. The yellow light-emitting layer was deposited over the hole-transport layer or over the blue-emitting layer, or both, on the hole-transport layer and the blue-emitting layer. These OLED devices have higher luminance yield and lower drive voltage. These OLED devices can be operated at higher current density with minimum degradation in the color coordinates and the luminance efficiency.

The invention has been described in detail with particular reference to certain preferred embodiments thereof, but it will be understood that variations and modifications can be effected within the spirit and scope of the invention.

Parts List

100 OLED device
110 substrate
120 anode contact
140 light-emitting layer
150 cathode
200 OLED device
210 light-transmissive substrate
220 transparent anode
220b hole injection layer
230 thin fluorocarbon layer
240 organic hole-transport layer
250 organic electroluminescent layer
260 organic electron-transport layer
270 cathode contact
300 OLED device
310 light-transmissive substrate
320 light-transmissive anode
330 hole injection layer
340 organic hole-transport layer
341 yellow light-emitting organic layer
350 organic emission layer
360 organic electron-transport layer.
370 cathode contact
400 OLED device
410 substrate
420 anode
430 hole injection layer
440 organic hole-transport layer
450 organic emission layer
460 electron-transport layer
461 yellow light-emitting organic layer
470 cathode contact
500 OLED device
510 substrate
520 anode
530 hole injection layer
540 organic hole-transport layer
541 yellow light-emitting organic layer
550 organic emission layer
560 organic electron-transport layer
561 yellow light-emitting organic
562 green emitting layer
570 cathode contact
600 OLED device

What is claimed is:

1. An organic light-emitting diode (OLED) device which produces substantially white light, comprising:

a) a substrate;

b) an anode disposed over the substrate;

c) a hole injecting layer disposed over the anode;

d) a hole-transport layer disposed over the hole injecting layer;

e) a yellow light-emitting layer having rubrene or a derivative thereof greater than 50% by volume of the constituents of such yellow light-emitting layer that emits light in the yellow region of the spectrum and is disposed on the hole-transport layer;

f) a light-emitting layer doped with a blue light-emitting compound, disposed directly on the yellow light-emitting layer;

g) an electron-transport layer disposed over the blue light-emitting layer; and h) a cathode disposed over the electron-transport layer.

2. The OLED device according to claim 1 wherein the hole-transport layer includes an aromatic tertiary amine.

3. The OLED device according to claim 1 wherein the electron-transport layer includes tris(8-hydroxy quinolinol) aluminum.

4. The OLED device according to claim 1 wherein the layer doped with a blue light-emitting compound includes at least one host material selected from the group consisting of:

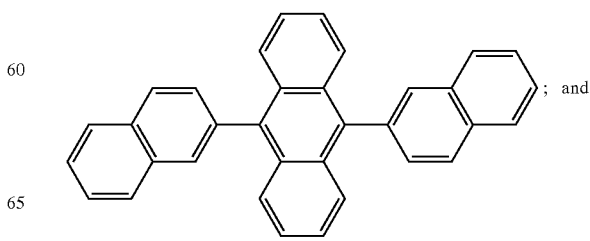
; and

-continued

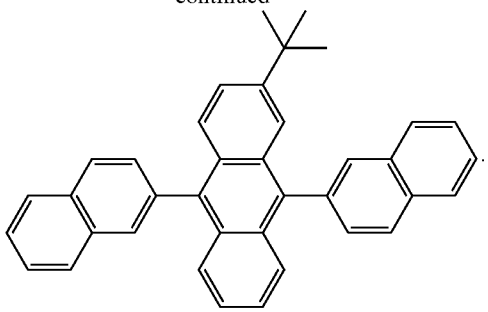

5. The OLED device according to claim 1 wherein the layer doped with a blue light-emitting compound includes the blue dopant selected from the group consisting of:
   i) perylene;
   ii) 2,5,8,11-tetra-tert-butyl perylene; and
   iii) conjugated benzenoids.

6. The OLED device according to claim 1 wherein the thickness of the yellow light-emitting layer is between 0.1 to 5 nm and the volume percent of the rubrene compound is greater than 50% by volume of the constituents of the yellow light-emitting layer.

7. The OLED device according to claim 1 wherein light-emitting layer doped with the blue light-emitting compound includes host material and the concentration of the blue light-emitting compound is between 0.1–10% percent of the host material.

8. The OLED device according to claim 1 wherein thickness of the hole-transport layer is between 20 nm–300 nm.

9. The OLED device according to claim 1 wherein thickness of the light-emitting layer doped with the blue light-emitting compound is between 10 nm–100 nm.

10. The OLED device according to claim 1 wherein thickness of the electron-transport layer is between 10 nm–150 nm.

11. The OLED device according to claim 1 wherein the cathode is selected from the group consisting of LiF/Al, Mg:Ag alloy, and Al—Li alloy.

12. The OLED device according to claim 1 wherein the cathode is transparent.

13. The OLED device according to claim 1 wherein the electron-transport layer is transparent.

14. An organic light-emitting diode device which produces substantially white light, comprising:
   a) a substrate;
   b) an anode disposed over the substrate;
   c) a hole injecting layer disposed over the anode;
   d) a hole-transport layer disposed over the hole injecting layer;
   e) a light-emitting layer doped with a blue light-emitting compound, disposed directly on the hole-transport layer;
   f) a yellow light-emitting layer having rubrene or a derivative thereof greater than 50% by volume of the constituents of such yellow light-emitting layer that emits light in the yellow region of the spectrum and is disposed on the blue-emitting layer;
   g) an electron-transport layer disposed directly over the yellow light-emitting layer; and
   h) a cathode disposed over the electron-transport layer.

15. The OLED device according to claim 14 wherein the hole-transport layer includes an aromatic tertiary amine.

16. The OLED device according to claim 14 wherein the electron-transport layer includes tris(8-hydroxy quinolinol) aluminum.

17. The OLED device according to claim 14 wherein the light-emitting layer doped with the blue light-emitting compound includes host material selected from the group consisting of:

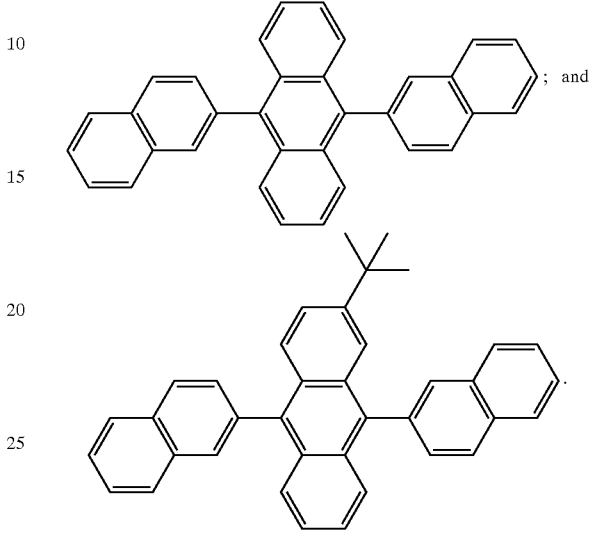

18. The OLED device according to claim 14 wherein the light-emitting layer doped with the blue light-emitting compound includes the blue dopant selected from the group consisting of:
   i) perylene;
   ii) 2,5,8,11-tetra-tert-butyl perylene; and
   iii) conjugated benzenoids.

19. The OLED device according to claim 14 wherein the thickness of the yellow light-emitting layer is between 0.1 to 5 nm and the percent of the rubrene compound is greater than 50% by volume of the constituents of the yellow light-emitting layer.

20. The OLED device according to claim 14 wherein light-emitting layer doped with the blue light-emitting compound includes host material and the concentration of the blue light-emitting compound is between 0.1–10% percent of the host material.

21. The OLED device according to claim 14 wherein thickness of the hole-transport layer is between 20–300 nm.

22. The OLED device according to claim 14 wherein thickness of the light-emitting layer doped with the blue light-emitting compound is between 10–100 nm.

23. The OLED device according to claim 14 wherein thickness of the electron-transport layer is between 100–150 nm.

24. The OLED device according to claim 14 wherein the cathode is selected from the group consisting of LiF/Al, Mg:Ag alloy, and Al—Li alloy.

25. The OLED device according to claim 14 wherein the cathode is transparent.

26. An organic light-emitting diode device which produce substantially white light, comprising:
   a) a substrate;
   b) an anode disposed over the substrate;
   c) a hole injecting layer disposed over the anode;
   d) a hole-transport layer disposed over the hole injecting layer;

e) a first yellow light-emitting layer having rubrene or a derivative thereof greater than 50% by volume of the constituents of such first yellow light-emitting layer that emits light in the yellow region of the spectrum and is disposed on the hole-transport layer;

f) a light-emitting layer doped with a blue light-emitting compound, disposed directly on the first yellow light-emitting layer;

g) a second yellow light-emitting layer having rubrene or a derivative thereof greater than 50% by volume of the constituents of such yellow light-emitting layer that emits light in the yellow region of the spectrum and is disposed on the blue-emitting layer;

h) an electron-transport layer disposed directly over the second yellow light-emitting layer; and i) a cathode disposed over the electron-transport layer.

27. The OLED device according to claim 26 wherein the hole-transport layer includes an aromatic tertiary amine.

28. The OLED device according to claim 26 the electron-transport layer includes tris(8-hydroxy quinolinol) aluminum.

29. The OLED device according to claim 26 wherein the electron-transport layer includes copper phthalocyanin compound.

30. The OLED device according to claim 26 wherein the light-emitting layer doped with the blue light-emitting compound includes host material selected from the group consisting of:

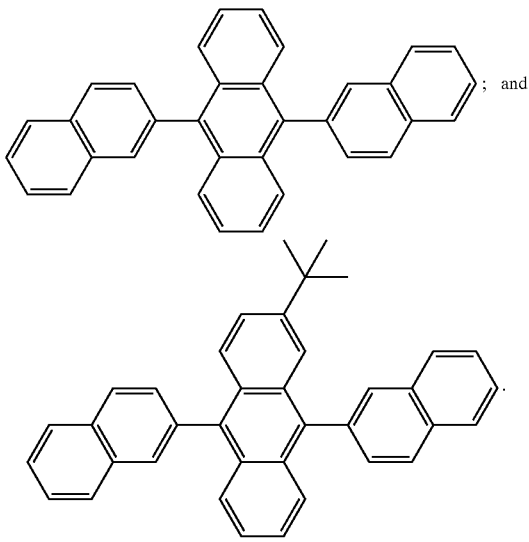

31. The OLED device according to claim 26 wherein the blue light-emitting layer doped with the blue light-emitting compound includes the blue dopant selected from the group consisting of:
  i) perylene;
  ii) 2,5,8,11-tetra-tert-butyl perylene; and
  iii) conjugated benzenoids.

32. The OLED device according to claim 26 wherein the thickness of both the first and second yellow light-emitting layers is between 0.1 to 10 nm and the volume percent of the rubrene compound is greater than 50% by volume of the constituents of each yellow light-emitting layer.

33. The OLED device according to claim 26 wherein light-emitting layer doped with the blue light-emitting compound includes host material and the concentration of the blue light-emitting compound is between 0.1–10% percent of the host material.

34. The OLED device according to claim 26 wherein thickness of the hole-transport layer is between 20–300 nm.

35. The OLED device according to claim 26 wherein thickness of the light-emitting layer doped with the blue light-emitting compound is between 10–100 nm.

36. The OLED device according to claim 26 wherein thickness of the electron-transport layer is between 100–150 nm.

37. The OLED device according to claim 26 wherein the cathode is selected from the group consisting of LiF/Al, Mg:Ag alloy, and Al—Li alloy.

38. The OLED device according to claim 26 wherein the cathode is transparent.

39. The OLED device according to claim 26 wherein the electron-transport layer is transparent.

40. An organic light-emitting diode device which produce substantially white light, comprising:
  a) a substrate;
  b) an anode disposed over the substrate;
  c) a hole injecting layer disposed over the anode;
  d) a hole-transport layer disposed over the hole injecting layer;
  e) a first yellow light-emitting layer having rubrene or a derivative thereof greater than 50% by volume of the constituents of such first yellow light-emitting layer that emits light in the yellow region of the spectrum and is disposed on the hole-transport layer;
  f) a light-emitting layer having a host material doped with a blue light-emitting compound, disposed directly on the first yellow light-emitting layer;
  g) a second yellow light-emitting layer having rubrene or a derivative thereof greater than 50% by volume of the constituents of such yellow light-emitting layer that emits light in the yellow region of the spectrum and is disposed on the blue-emitting layer;
  h) a green emitting layer disposed on the second yellow emitting layer;
  i) an electron-transport layer disposed directly over the green light-emitting layer; and
  j) a cathode disposed over the electron-transport layer.

41. The OLED device according to claim 40 wherein the hole-transport layer includes an aromatic tertiary amine.

42. The OLED device according to claim 40 the electron-transport layer includes tris(8-hydroxy quinolinol) aluminum.

43. The OLED device according to claim 40 wherein the electron-transport layer includes copper phthalocyanin compound.

44. The OLED device according to claim 41 wherein the light-emitting layer doped with the blue light-emitting compound includes host material selected from the group consisting of:

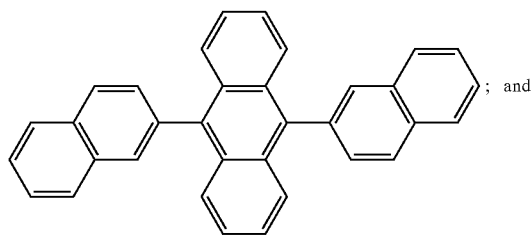

-continued

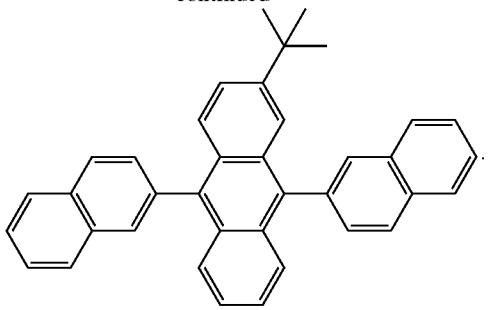

45. The OLED device according to claim 40 wherein the light-emitting layer doped with the blue light-emitting compound includes the blue dopant selected from the group consisting of:
  i) perylene;
  ii) 2,5,8,11-tetra-tert-butyl perylene; and
  iii) conjugated benzenoids.

46. The OLED device according to claim 40 wherein the thickness of both the first and second yellow light-emitting layers is between 0.1 to 10 nm and the weight percent of the rubrene compound is greater than 50% by volume of the constituents of each yellow light-emitting layer.

47. The OLED device according to claim 40 wherein dopant concentration for the blue dopant is between 0.1–10% percent of the host material.

48. The OLED device according to claim 40 wherein thickness of the hole-transport layer is between 20–300 nm.

49. The OLED device according to claim 40 wherein thickness of the light-emitting layer doped with the blue light-emitting compound is between 10–100 nm.

50. The OLED device according to claim 40 wherein thickness of the electron-transport layer is between 100–150 nm.

51. The OLED device according to claim 40 wherein the cathode is selected from the group consisting of LiF/Al, Mg:Ag alloy, and Al—Li alloy.

52. The OLED device according to claim 40 wherein the cathode is transparent.

53. The OLED device according to claim 40 wherein the electron-transport layer is transparent.

* * * * *